(12) United States Patent
Sakata et al.

(10) Patent No.: US 12,199,583 B2
(45) Date of Patent: Jan. 14, 2025

(54) METHOD FOR MANUFACTURING VIBRATION ELEMENT

(71) Applicant: Seiko Epson Corporation, Tokyo (JP)

(72) Inventors: Hiyori Sakata, Minowa (JP); Takuro Kobayashi, Minowa (JP); Ryuta Nishizawa, Nagano (JP); Shigeru Shiraishi, Ina (JP); Keiichi Yamaguchi, Ina (JP)

(73) Assignee: SEIKO EPSON CORPORATION (JP)

(*) Notice: Subject to any disclaimer, the term of this patent is extended or adjusted under 35 U.S.C. 154(b) by 498 days.

(21) Appl. No.: 17/679,280

(22) Filed: Feb. 24, 2022

(65) Prior Publication Data

US 2022/0271725 A1    Aug. 25, 2022

(30) Foreign Application Priority Data

Feb. 25, 2021 (JP) ................... 2021-028273
Aug. 26, 2021 (JP) ................... 2021-137808

(51) Int. Cl.
*H04R 31/00* (2006.01)
*H03H 3/013* (2006.01)

(52) U.S. Cl.
CPC .................. *H03H 3/013* (2013.01)

(58) Field of Classification Search
CPC ...... H03H 3/013; H03H 3/02; H03H 9/02157; H03H 9/215; H03H 2003/026
See application file for complete search history.

(56) References Cited

U.S. PATENT DOCUMENTS 10,072,928 B2 * 9/2018 Ishii .................. H10N 30/302

FOREIGN PATENT DOCUMENTS

| JP | 2007-013382 A | 1/2007 |
| JP | 2008-205657 A | 9/2008 |
| JP | 2018-148380 A | 9/2018 |

* cited by examiner

*Primary Examiner* — Paul D Kim
(74) *Attorney, Agent, or Firm* — Harness, Dickey & Pierce, P.L.C.

(57) ABSTRACT

A method for manufacturing a vibration element includes: a first dry etching step of dry etching the quartz crystal substrate from a first surface and forming first grooves and contours of a first vibrating arm and a second vibrating arm on the first surface; and a second dry etching step of dry etching the quartz crystal substrate from a second surface side and forming second grooves and contours of the first vibrating arm and the second vibrating arm on the second surface, in which Wa/Aa<1 in at least one of the first and second dry etching steps, Wa is a depth of the first and second grooves formed in the first and second dry etching steps, and Aa is a depth of the contours formed in the first and second dry etching steps.

6 Claims, 14 Drawing Sheets

METHOD FOR MANUFACTURING VIBRATION ELEMENT

The present application is based on, and claims priority from JP Application Serial Number 2021-028273, filed Feb. 25, 2021, and JP Application Serial Number 2021-137808, filed Aug. 26, 2021, the disclosures of which are hereby incorporated by reference herein in their entireties.

BACKGROUND

1. Technical Field

The present disclosure relates to a method for manufacturing a vibration element.

2. Related Art

JP-A-2007-013382 describes a method for manufacturing a vibration element in which the vibration element including a pair of grooved vibrating arms is formed by dry etching. In this manufacturing method, a width of each groove is narrowed with respect to a width between the pair of vibrating arms, so that by using a micro-loading effect, an etching depth of the groove is made shallower than an etching depth between the pair of vibrating arms, and the grooves and a contour shape of the vibration element are collectively formed.

However, the method for manufacturing the vibration element in JP-A-2007-013382 has a problem that if a dry etching time varies, the depth of the groove varies, and vibration characteristics of the vibration element vary accordingly.

SUMMARY

A method for manufacturing a vibration element according to the present disclosure is a method for manufacturing a vibration element including: a base portion; and a first vibrating arm and a second vibrating arm extending from the base portion along a first direction and arranged along a second direction intersecting the first direction, in which the first vibrating arm and the second vibrating arm each includes a first surface and a second surface arranged in a third direction intersecting the first direction and the second direction and on front and back sides, respectively, a bottomed first groove opened in the first surface, and a bottomed second groove opened in the second surface. The method includes: a preparing step of preparing a quartz crystal substrate having the first surface and the second surface; a first protective film forming step of forming a first protective film on the first surface of the quartz crystal substrate, excluding first groove forming regions where the first grooves are formed and an inter-arm region located between a first vibrating arm forming region where the first vibrating arm is formed and a second vibrating arm forming region where the second vibrating arm is formed; a first dry etching step of dry etching the quartz crystal substrate from a first surface side via the first protective film and forming the first grooves and contours of the first vibrating arm and the second vibrating arm on the first surface; a second protective film forming step of forming a second protective film on the second surface of the quartz crystal substrate, excluding second groove forming regions where the second grooves are formed and the inter-arm region; and a second dry etching step of dry etching the quartz crystal substrate from a second surface side via the second protective film and forming the second grooves and contours of the first vibrating arm and the second vibrating arm on the second surface, in which Wa/Aa<1 in at least one of the first dry etching step and the second dry etching step, wherein Wa indicates a depth of the first grooves formed in the first dry etching step and a depth of the second grooves formed in the second dry etching step, and Aa indicates a depth of the contours formed in the first dry etching step and a depth of the contours formed in the second dry etching step.

DESCRIPTION OF EXEMPLARY EMBODIMENTS

Figure 1:
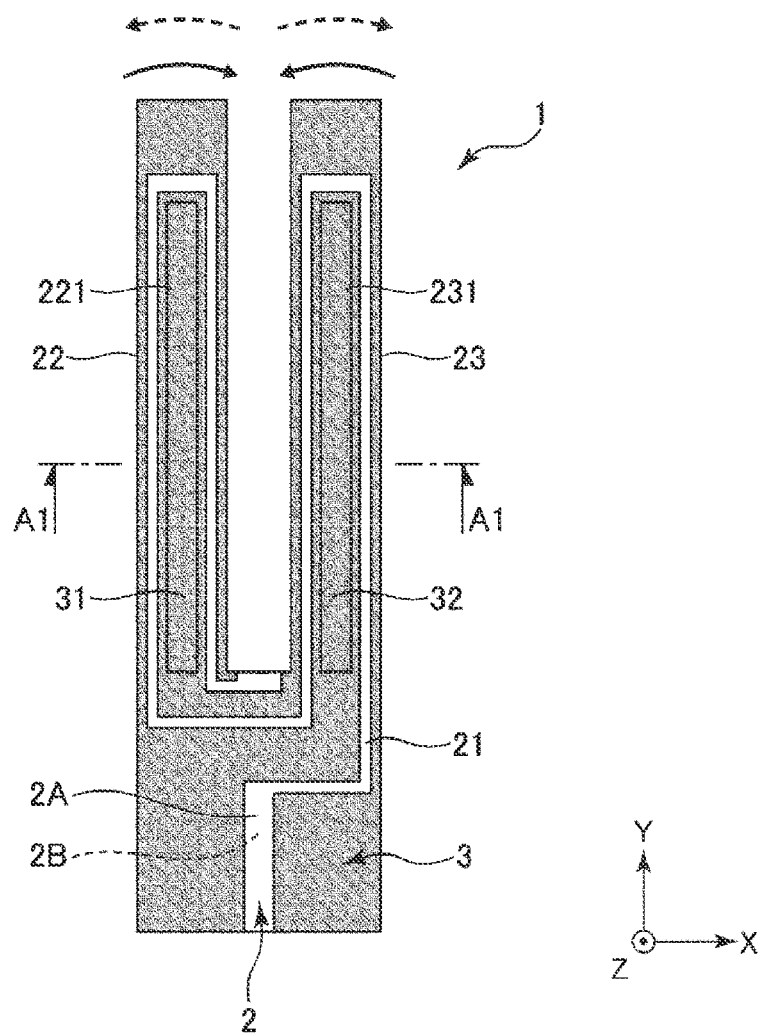
FIG. 1 is a plan view illustrating a vibration element according to a preferred embodiment of the present disclosure.

Hereinafter, a method for manufacturing a vibration element according to the present disclosure will be described in detail based on embodiments illustrated in the drawings.

Figure 2:
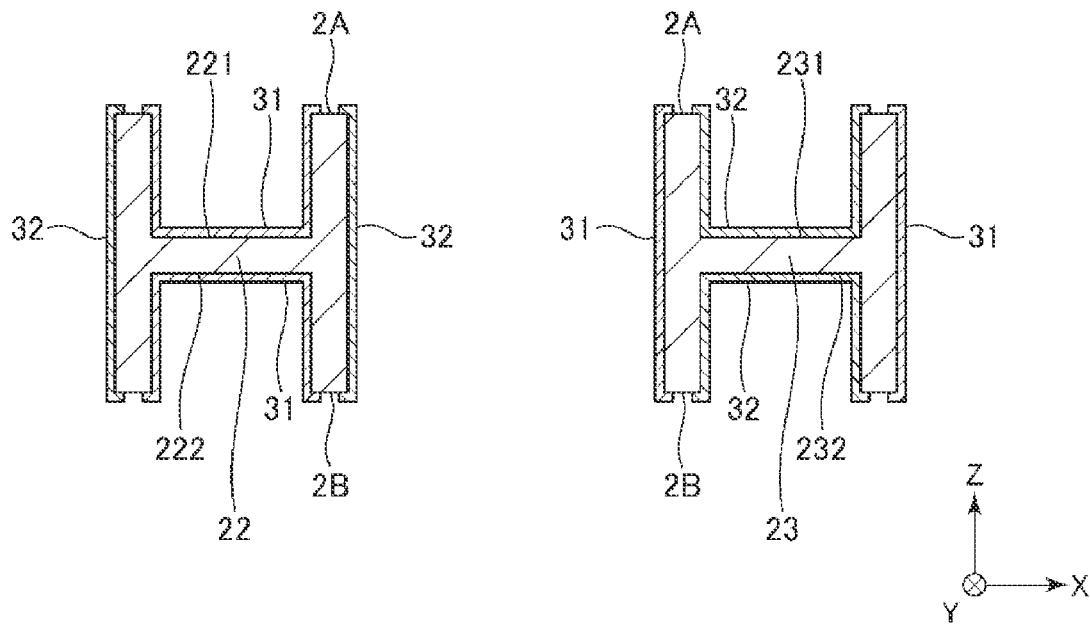
FIG. 2 is a cross-sectional view taken along a line A1-A1 in FIG. 1.
Figure 3:
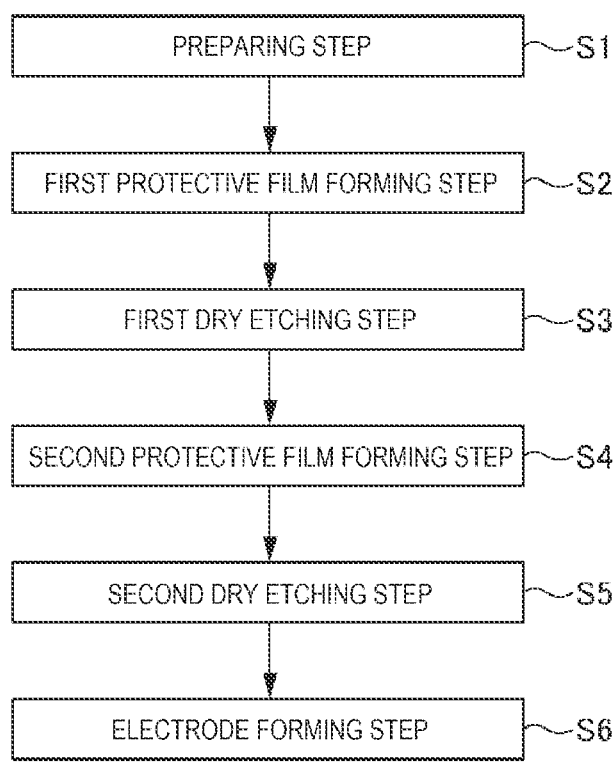
FIG. 3 is a diagram illustrating steps of manufacturing the vibration element in FIG. 1.
Figure 11:
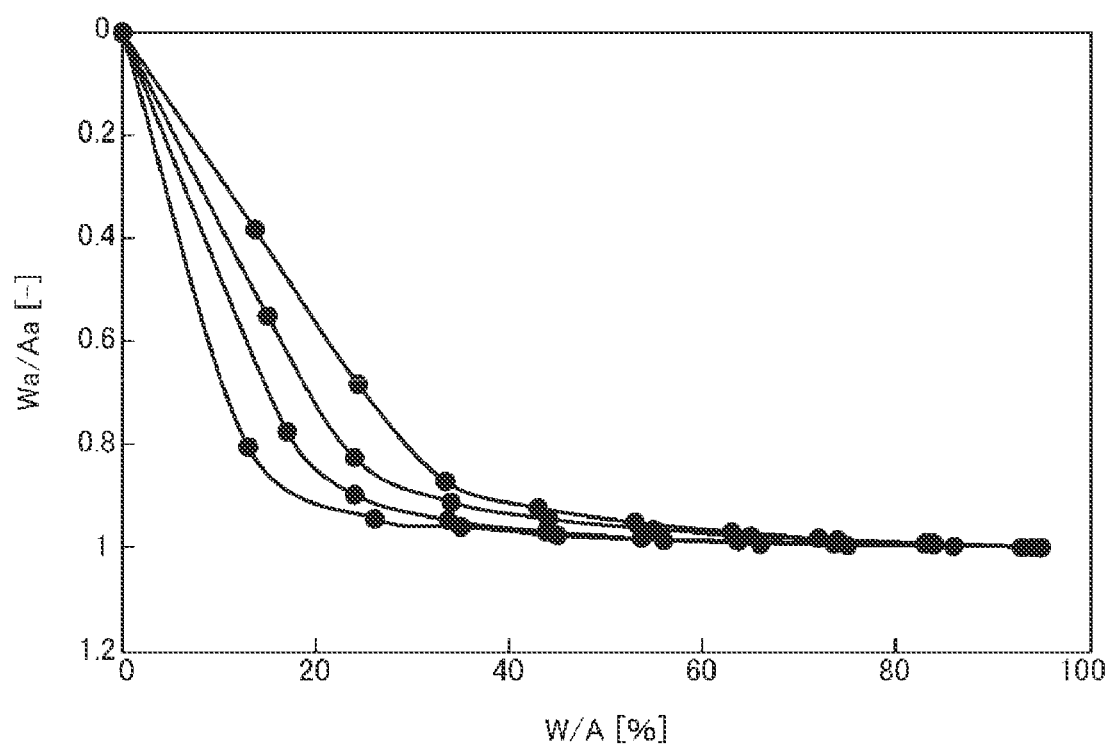
FIG. 11 is a graph illustrating a relation between W/A and Wa/Aa when etching times are different.
Figure 12:
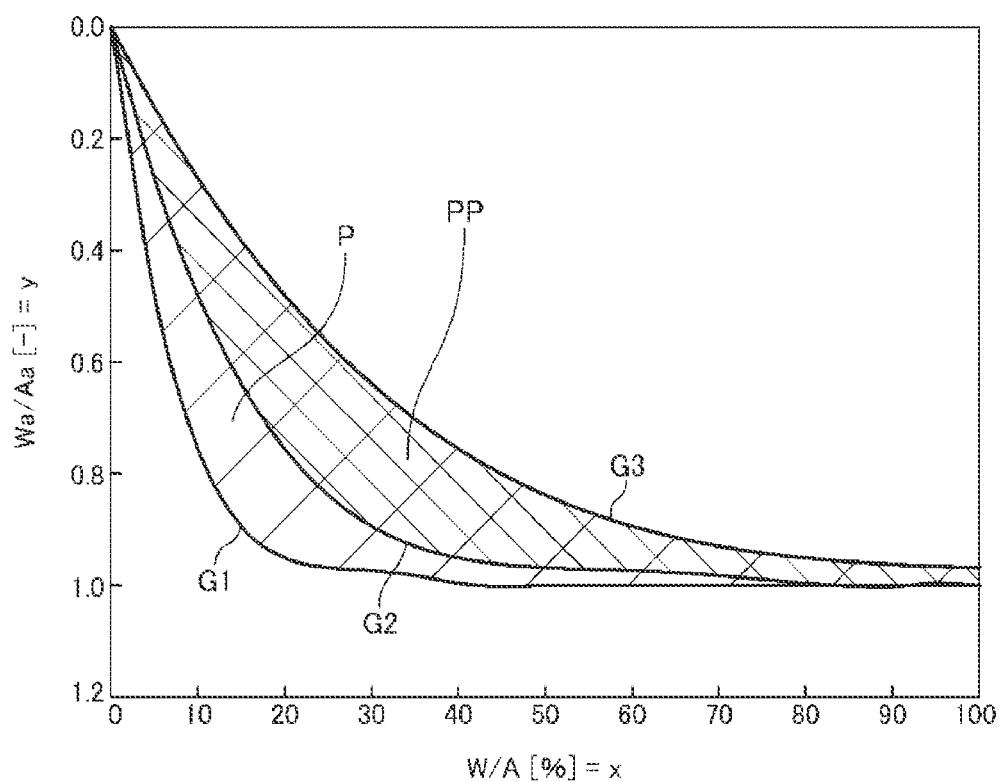
FIG. 12 is a graph illustrating a relation between W/A and Wa/Aa when reaction gases are different.
Figure 13:
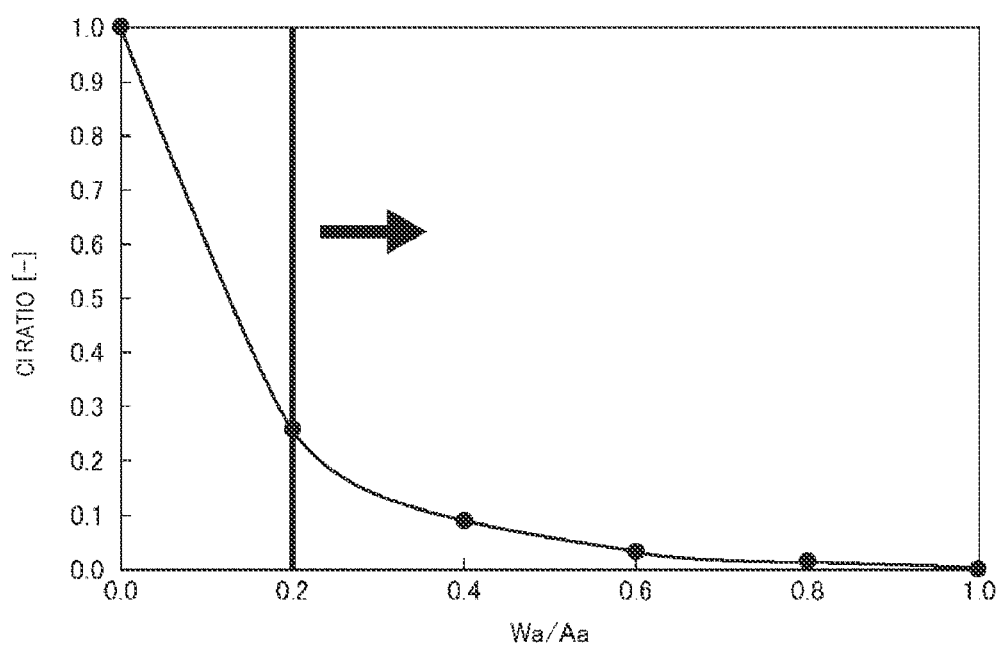
FIG. 13 is a graph illustrating a relation between Wa/Aa and a CI value.
Figure 14:
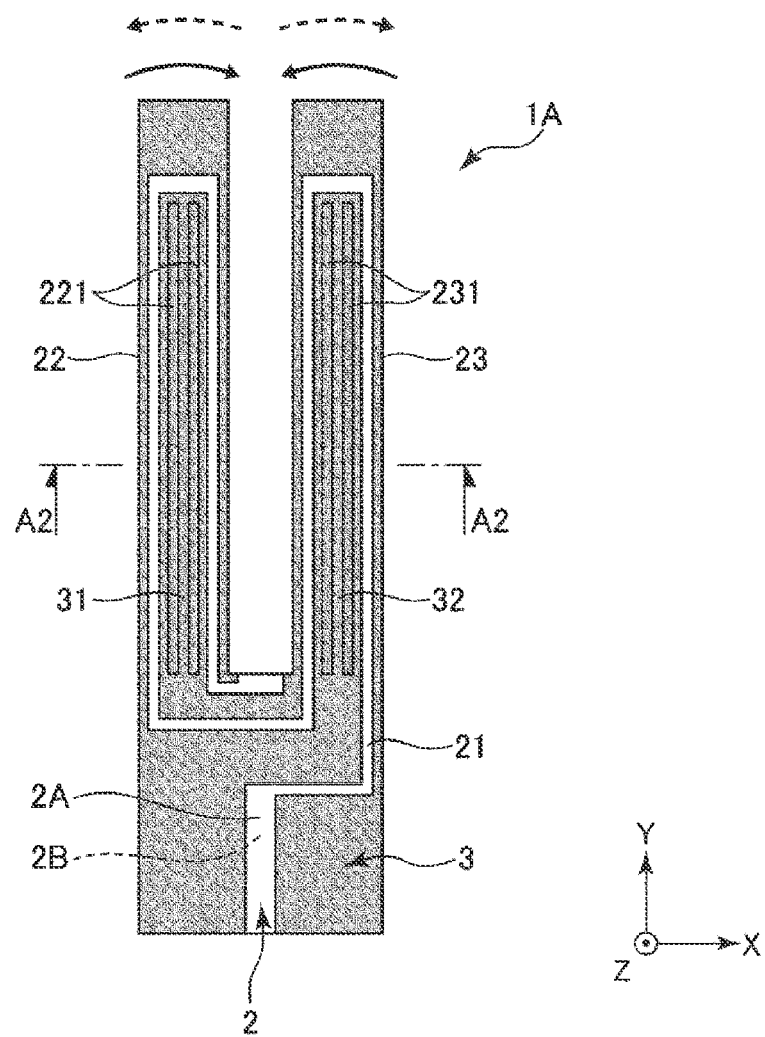
FIG. 14 is a plan view illustrating a modification of the vibration element.
Figure 15:
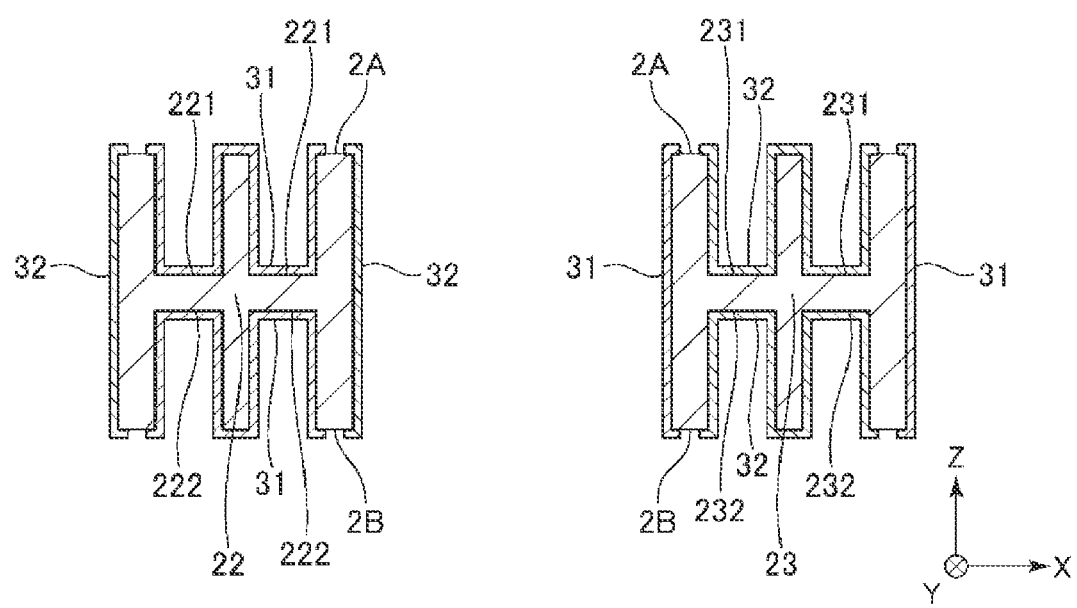
FIG. 15 is a cross-sectional view taken along a line A2-A2 in FIG. 14.
Figure 16:
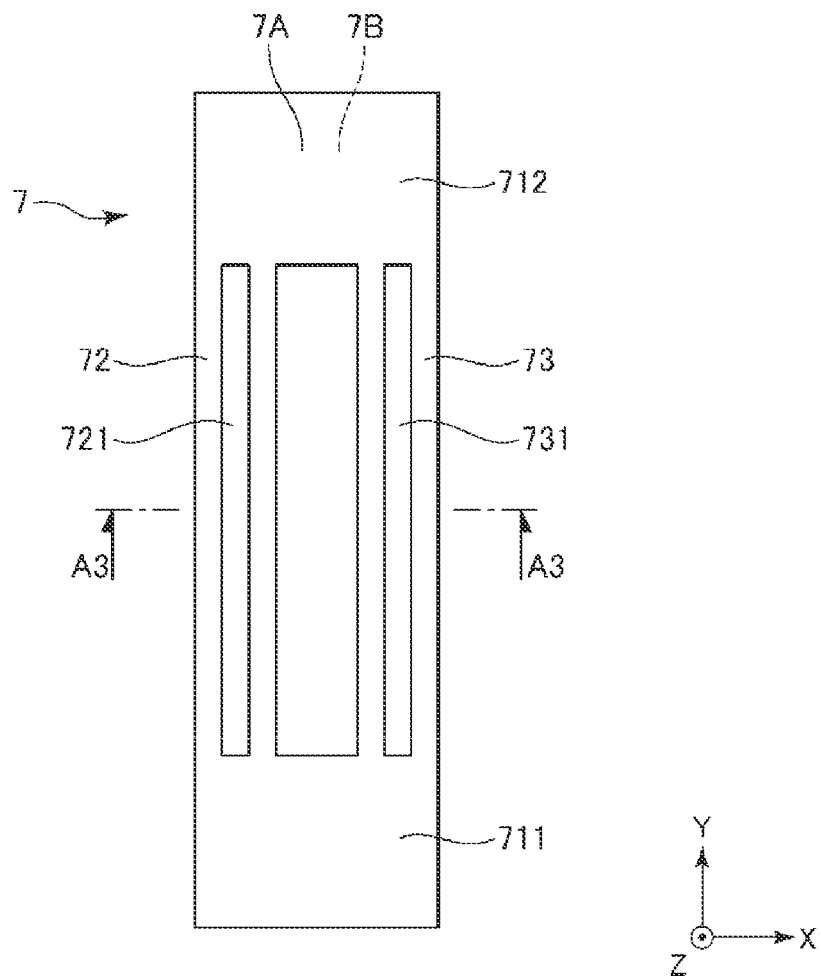
FIG. 16 is a plan view illustrating a modification of the vibration element.
Figure 17:
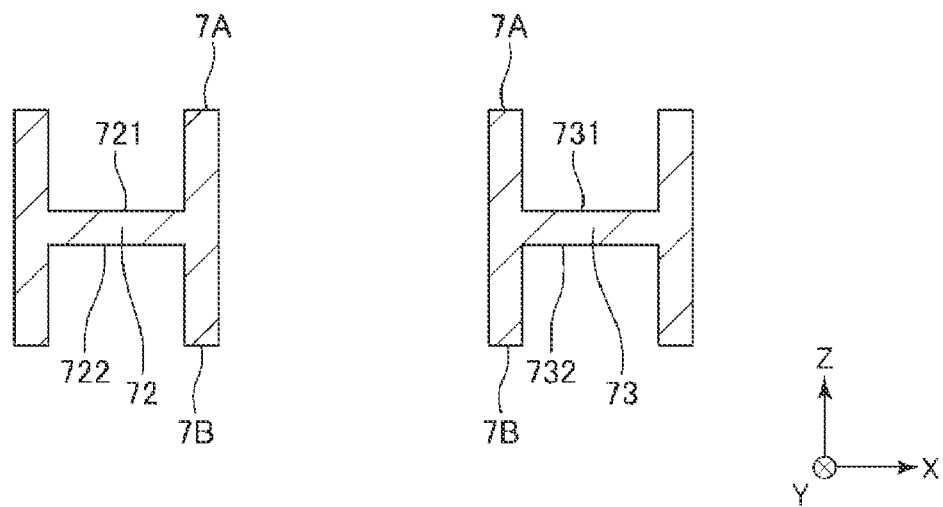
FIG. 17 is a cross-sectional view taken along a line A3-A3 in FIG. 16.
Figure 18:
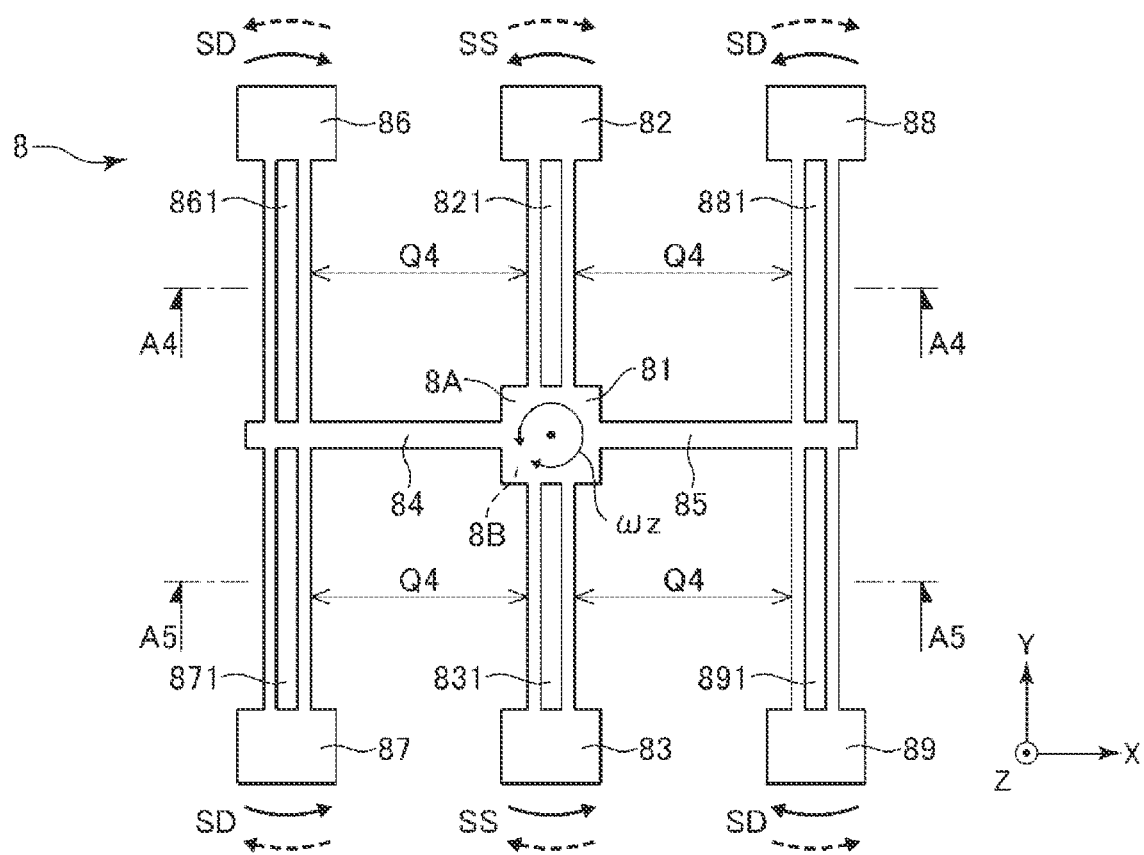
FIG. 18 is a plan view illustrating a modification of the vibration element.
Figure 19:
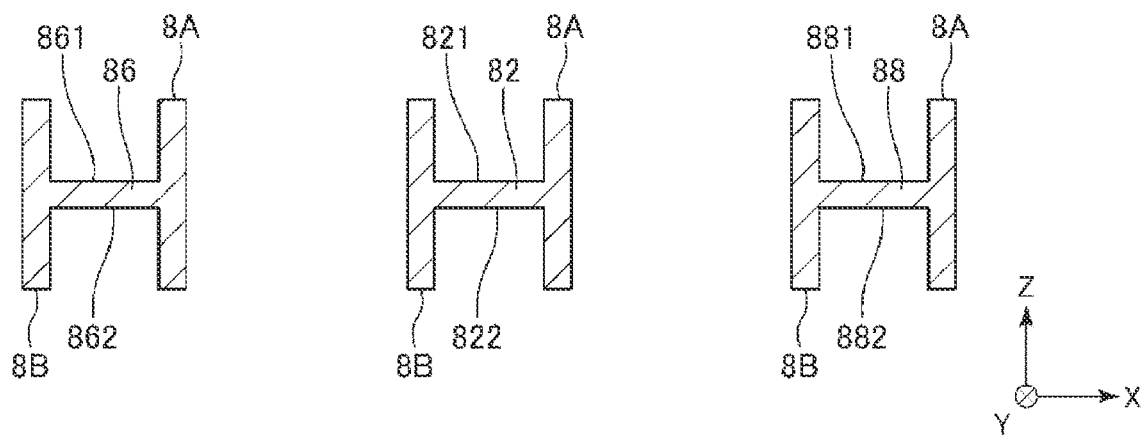
FIG. 19 is a cross-sectional view taken along a line A4-A4 in FIG. 18.
Figure 20:
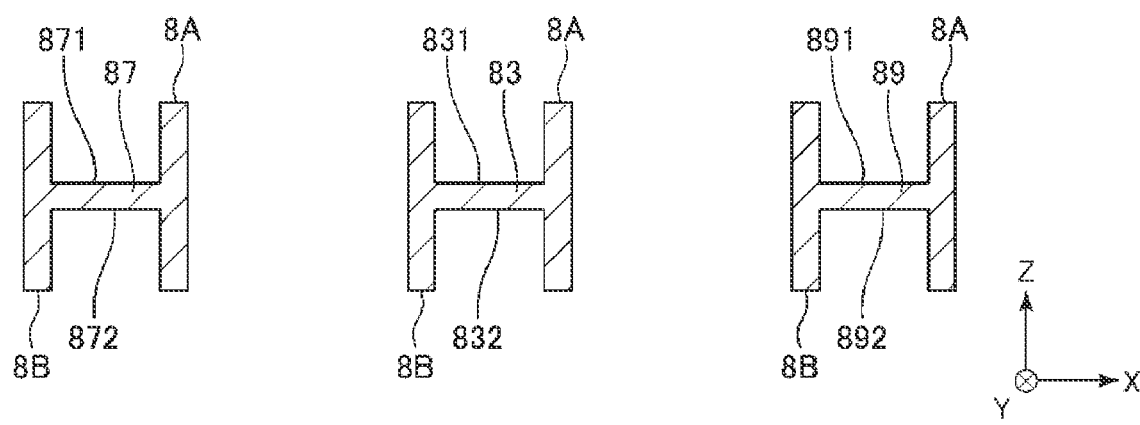
FIG. 20 is a cross-sectional view taken along a line A5-A5 in FIG. 18.
Figure 21:
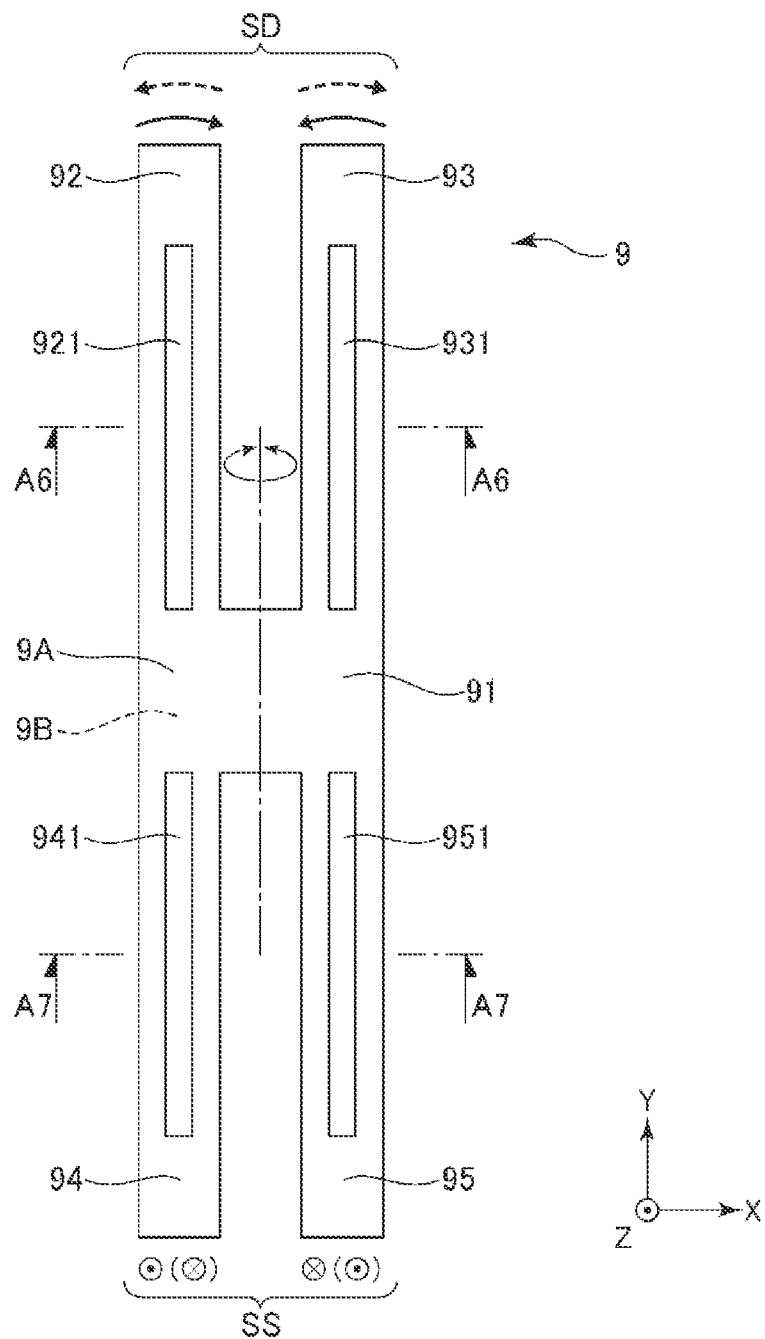
FIG. 21 is a plan view illustrating a modification of the vibration element.
Figure 22:
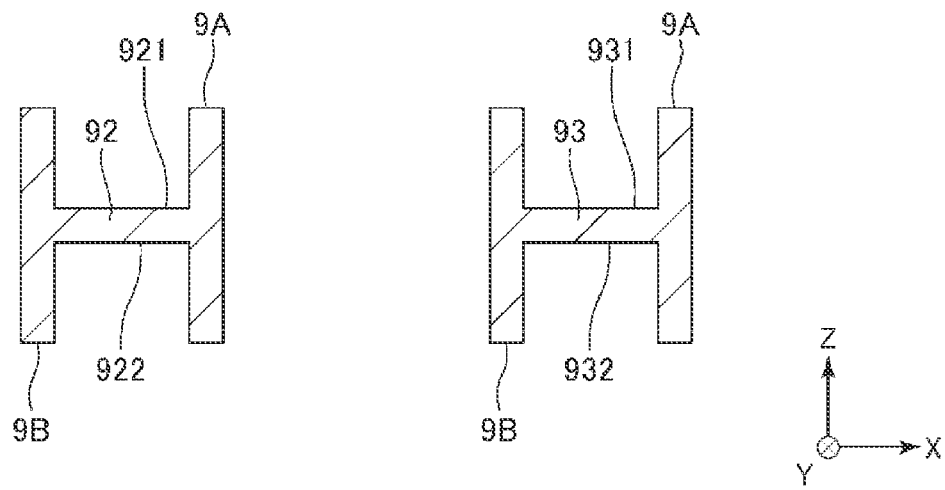
FIG. 22 is a cross-sectional view taken along a line A6-A6 in FIG. 21.
Figure 23:
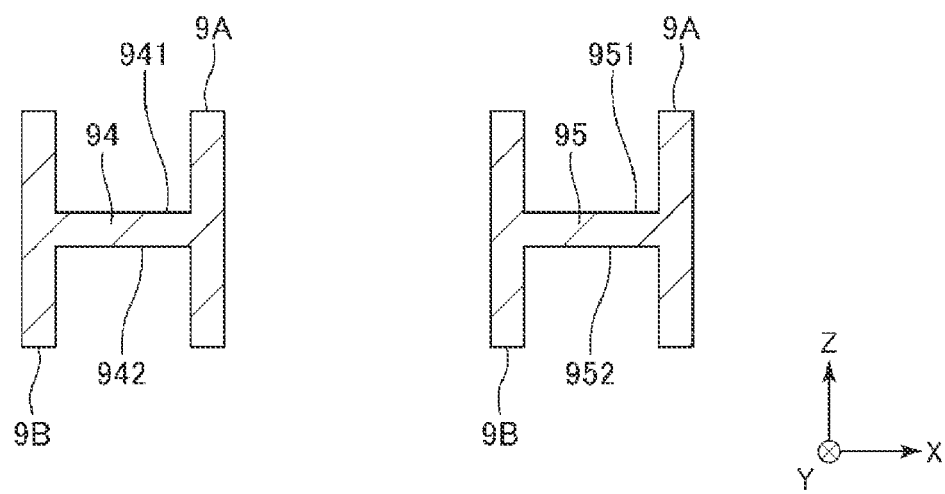
FIG. 23 is a cross-sectional view taken along a line A7-A7 in FIG. 21.

FIG. 1 is a plan view illustrating a vibration element according to a preferred embodiment of the present disclosure. FIG. 2 is a cross-sectional view taken along a line A1-A1 in FIG. 1. FIG. 3 is a diagram illustrating steps of manufacturing the vibration element in FIG. 1. FIGS. 4 to 10 are cross-sectional views each illustrating a method for manufacturing the vibration element of FIG. 1. FIG. 11 is a graph illustrating a relation between W/A and Wa/Aa when etching times are different. FIG. 12 is a graph illustrating a relation between W/A and Wa/Aa when reaction gases are different. FIG. 13 is a graph illustrating a relation between Wa/Aa and a CI value. FIG. 14 is a plan view illustrating a modification of the vibration element. FIG. 15 is a cross-sectional view taken along a line A2-A2 in FIG. 14. FIG. 16 is a plan view illustrating a modification of the vibration element. FIG. 17 is a cross-sectional view taken along a line A3-A3 in FIG. 16. FIG. 18 is a plan view illustrating a modification of the vibration element. FIG. 19 is a cross-sectional view taken along a line A4-A4 in FIG. 18. FIG. 20 is a cross-sectional view taken along a line A5-A5 in FIG. 18. FIG. 21 is a plan view illustrating a modification of the vibration element. FIG. 22 is a cross-sectional view taken along a line A6-A6 in FIG. 21. FIG. 23 is a cross-sectional view taken along a line A7-A7 in FIG. 21.

For the convenience of description, an X-axis, a Y-axis, and a Z-axis, which are three axes orthogonal to each other, are illustrated in each of the drawings except FIG. 3 and FIGS. 11 to 13. A direction along the X-axis is also called an X-axis direction (a second direction), a direction along the Y-axis is also called a Y-axis direction (a first direction), and a direction along the Z-axis is also called a Z-axis direction (a third direction). An arrow side of each axis is also called a plus side, and an opposite side is also called a minus side. The plus side in the Z-axis direction is also called "upper", and the minus side is also called "lower". A plan view from the Z-axis direction is also simply called a "plan view". The X-axis, the Y-axis, and the Z-axis, as will be described later, correspond to crystal axes of a quartz crystal.

Before illustrating a method for manufacturing a vibration element 1, a configuration of the vibration element 1 is described based on FIGS. 1 and 2. The vibration element is a tuning fork type vibration element and includes a vibrating substrate 2 and an electrode 3 formed on a surface of the vibrating substrate 2.

The vibrating substrate 2 is formed by patterning a Z-cut quartz crystal substrate (a Z-cut quartz crystal plate) into a desired shape, has an extension in an X-Y plane defined by the X-axis and the Y-axis, which are the crystal axes of the quartz crystal, and has a thickness in the Z-axis direction. The X-axis is also called an electrical axis, the Y-axis is also called a mechanical axis, and the Z-axis is also called an optical axis.

The vibrating substrate 2 has a plate shape and has a first surface 2A and a second surface 2B arranged on front and back sides respectively in the Z-axis direction. The vibrating substrate 2 includes a base portion 21, and a first vibrating arm 22 and a second vibrating arm 23 extending from the base portion 21 along the Y-axis direction and arranged along the X-axis direction.

The first vibrating arm 22 includes a bottomed first groove 221 opened in the first surface 2A, and a bottomed second groove 222 opened in the second surface 2B. Similarly, the second vibrating arm 23 includes a bottomed first groove 231 opened in the first surface 2A and a bottomed second groove 232 opened in the second surface 2B. The grooves 221, 222, 231, and 232 each extend along the Y-axis direction. Therefore, each of cross-sectional shapes of the first and second vibrating arms 22 and 23 is substantially an H shape. Accordingly, the vibration element 1 has a reduced thermoelastic loss and excellent vibration characteristics.

The electrode 3 includes signal electrodes 31 and ground electrodes 32. The signal electrodes 31 are disposed on the first surface 2A and the second surface 2B of the first vibrating arm 22 and two side surfaces of the second vibrating arm 23. The ground electrodes 32 are disposed on two side surfaces of the first vibrating arm 22 and the first surface 2A and the second surface 2B of the second vibrating arm 23. When a drive signal is applied to the signal electrodes 31 with the ground electrodes 32 grounded, as illustrated by an arrow in FIG. 1, the first vibrating arm 22 and the second vibrating arm 23 bend and vibrate in the X-axis direction so as to repeatedly approach and separate from each other.

The vibration element 1 is simply described above. Next, the method for manufacturing the vibration element 1 will be described. As illustrated in FIG. 3, the method for manufacturing the vibration element 1 includes a preparing step S1 of preparing a quartz crystal substrate 20 which is a base material of the vibrating substrate 2, a first protective film forming step S2 of forming a first protective film 5 on the first surface 2A of the quartz crystal substrate 20, a first dry etching step S3 of dry etching the quartz crystal substrate 20 from a first surface 2A side via the first protective film 5, a second protective film forming step S4 of forming a second protective film 6 on the second surface 2B of the quartz crystal substrate 20, a second dry etching step S5 of dry etching the quartz crystal substrate 20 from a second surface 2B side via the second protective film 6, and an electrode forming step S6 of forming the electrode 3 on the surfaces of the vibrating substrate 2 obtained by the above steps. Hereinafter, these steps will be described in order.

Preparing Step S1

Figure 4:
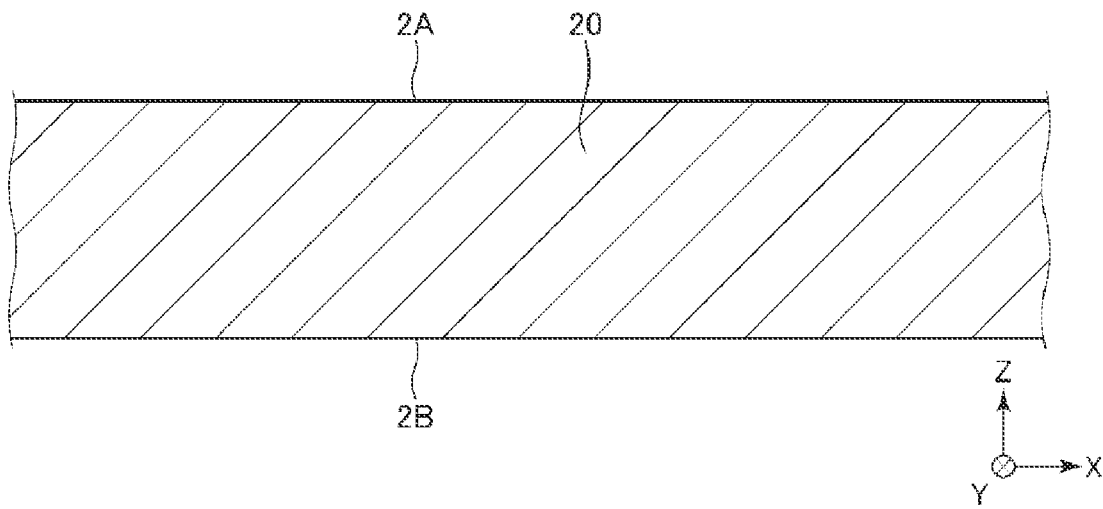
FIG. 4 is a cross-sectional view illustrating a method for manufacturing the vibration element of FIG. 1.

As illustrated in FIG. 4, the quartz crystal substrate 20, which is the base material of the vibrating substrate 2, is prepared. The quartz crystal substrate 20 is adjusted to a desired thickness by chemical mechanical polishing (CMP) or the like, and has the sufficiently smooth first surface 2A and second surface 2B. A plurality of vibration elements 1 are collectively formed from the quartz crystal substrate 20.

First Protective Film Forming Step S2

Figure 5:
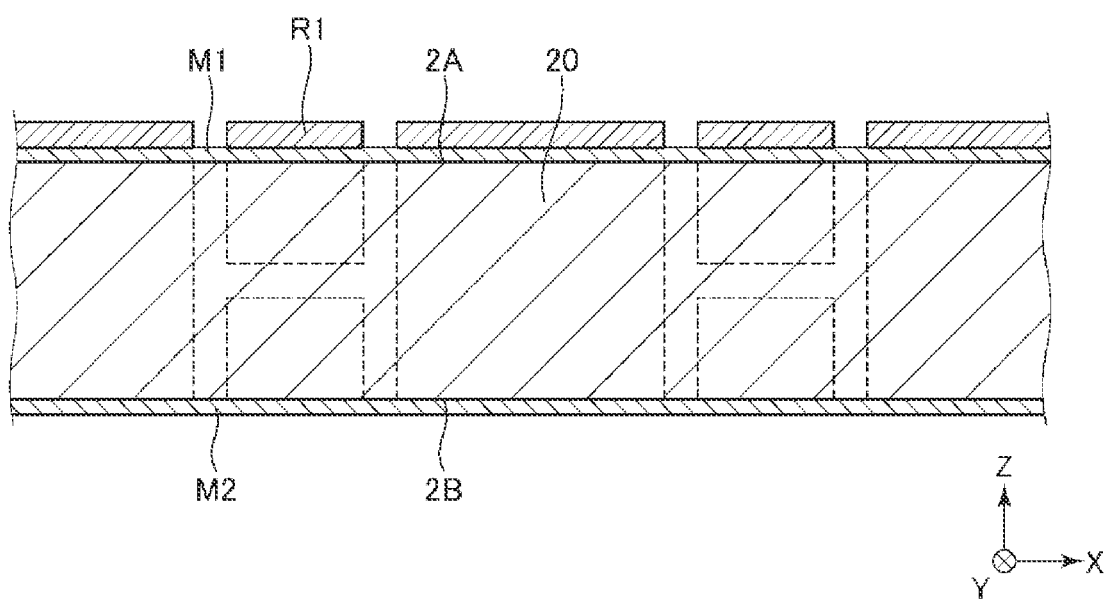
FIG. 5 is a cross-sectional view illustrating the method for manufacturing the vibration element of FIG. 1.
Figure 6:
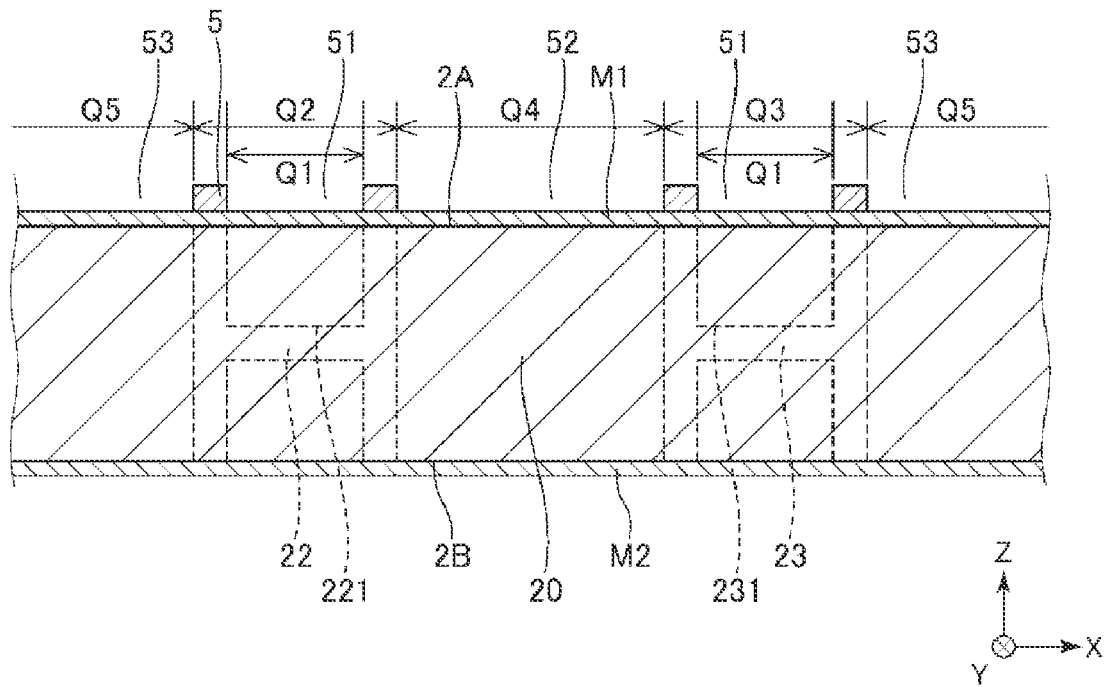
FIG. 6 is a cross-sectional view illustrating the method for manufacturing the vibration element of FIG. 1.

As illustrated in FIG. 5, metal films M1 and M2 are formed on the first surface 2A and the second surface 2B of the quartz crystal substrate 20, respectively. Then, a first resist film R1 is formed on the metal film M1 and the formed first resist film R1 is patterned. Next, the first protective film 5 is formed on opening portions of the first resist film R1, and then the first resist film R1 is removed. Accordingly, the quartz crystal substrate 20 becomes as illustrated in FIG. 6. The first protective film 5 is not particularly limited as long as it has etching resistance, and various metal masks such as a nickel mask can be used.

The first protective film 5 includes openings 51, 52, and 53 in parts to be removed from the quartz crystal substrate 20. Among these openings, the openings 51 overlap first groove forming regions Q1 where the first grooves 221 and 231 are formed. The opening 52 overlaps an inter-arm region Q4 located between a first vibrating arm forming region Q2 where the first vibrating arm 22 is formed and a second vibrating arm forming region Q3 where the second vibrating arm 23 is formed. The opening 53 overlaps an inter-element region Q5 located between the adjacent vibrating substrates 2. That is, the first protective film 5 is formed in a region except the groove forming regions Q1, the inter-arm region Q4, and the inter-element region Q5.

First Dry Etching Step S3

Figure 7:
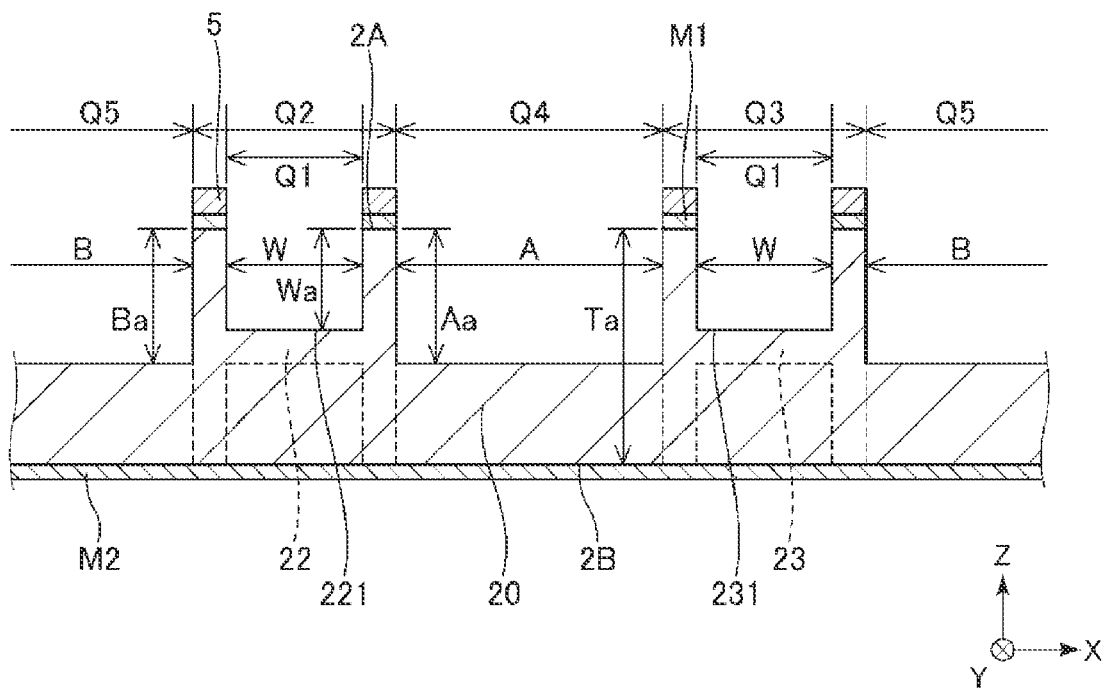
FIG. 7 is a cross-sectional view illustrating the method for manufacturing the vibration element of FIG. 1.

As illustrated in FIG. 7, the quartz crystal substrate 20 is dry etched from the first surface 2A side via the first protective film 5, and the first grooves 221 and 231 and a contour of the vibrating substrate 2 are simultaneously formed on the first surface 2A. It should be noted that "simultaneously formed" refers to collectively forming the grooves and the contour in one step. More specifically, the present step is reactive ion etching and is performed by using a reactive ion etching (RIE) apparatus. A reaction gas introduced into the RIE apparatus is not particularly limited, and for example, $SF_6$, $CF_4$, $C_2F_4$, $C_2F_6$, $C_3F_6$, and $C_4F_8$ can be used.

The present step ends when the first grooves 221 and 231 reach a desired depth. Here, in the dry etching, a "micro-loading effect" that an etching rate decreases as a pattern density of the first protective film 5 increases is known. In the present embodiment, when a width W of each of the first grooves 221 and 231 in the X-axis direction is compared with a width A of the inter-arm region Q4 in the X-axis direction, W<A. When the width W is compared with a width B of the inter-element region Q5 in the X-axis direction, W<B. Therefore, due to the micro-loading effect, an etching rate of the first groove forming regions Q1 becomes lower than etching rates of the inter-arm region Q4 and the inter-element region Q5. Thus, at the end of the present step, a depth Wa of the first grooves 221 and 231 is shallower than depths Aa and Ba of the contour of the vibrating substrate 2. That is, Wa<Aa (Wa/Aa<1) and Wa<Ba (Wa/Ba<1). The depths Aa and Ba are each equal to or more than half a thickness of the quartz crystal substrate 20. That is, if the thickness of the quartz crystal substrate 20 is Ta, Aa≥0.5 Ta and Ba≥0.5 Ta. The depth Wa, the depth Aa, and the depth Ba are defined as depths of deepest parts in the regions with the width W, the width A, and the width B, respectively.

After ending the present step, the first protective film 5 and the metal film M1 are removed, and a process proceeds to a treatment on a back surface of the quartz crystal substrate 20.

Second Protective Film Forming Step S4

Figure 8:
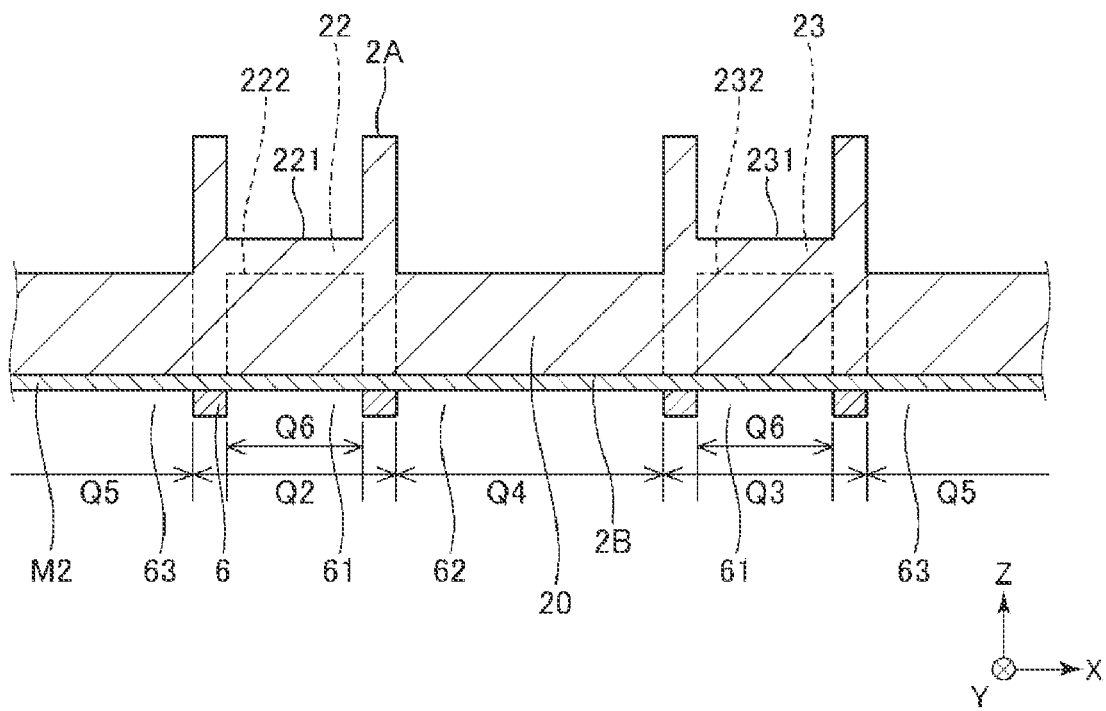
FIG. 8 is a cross-sectional view illustrating the method for manufacturing the vibration element of FIG. 1.

As illustrated in FIG. 8, the second protective film 6 is formed on the metal film M2. A method for forming the second protective film 6 is the same as the method for forming the first protective film 5 described above. The second protective film 6 includes openings 61, 62, and 63 in parts to be removed from the quartz crystal substrate 20. Among the openings, the openings 61 overlap second groove forming regions Q6 where the second grooves 222 and 232 are formed. The opening 62 overlaps the inter-arm region Q4. The opening 63 overlaps the inter-element region Q5.

Second Dry Etching Step S5

Figure 9:
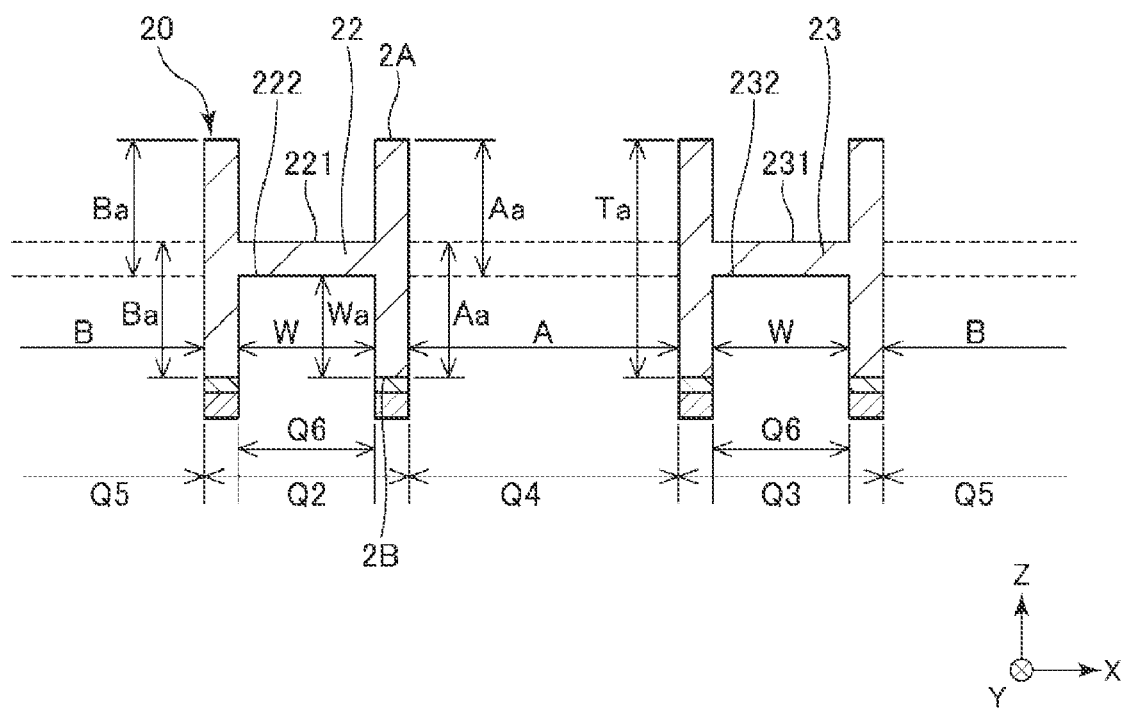
FIG. 9 is a cross-sectional view illustrating the method for manufacturing the vibration element of FIG. 1.

As illustrated in FIG. 9, the quartz crystal substrate 20 is dry etched from the second surface 2B side via the second protective film 6, and the second grooves 222 and 232 and the contour of the vibrating substrate 2 are simultaneously formed on the second surface 2B. The present step is performed in the same manner as the first dry etching step S3.

The present step ends when the second grooves 222 and 232 reach a desired depth. In the present embodiment, when the width W of each of the second grooves 222 and 232 in the X-axis direction is compared with the width A of the inter-arm region Q4 in the X-axis direction, W<A. When the width W is compared with the width B of the inter-element region Q5 in the X-axis direction, W<B. Therefore, due to the micro-loading effect, an etching rate of the second groove forming regions Q6 becomes lower than the etching rates of the inter-arm region Q4 and the inter-element region Q5. Thus, the depth Wa of the second grooves 222 and 232 is shallower than the depths Aa and Ba of the contour of the vibrating substrate 2. That is, Wa<Aa (Wa/Aa<1) and Wa<Ba (Wa/Ba<1). The depths Aa and Ba are each equal to or more than half the thickness of the quartz crystal substrate 20. That is, Aa≥0.5 Ta and Ba≥0.5 Ta. Therefore, the inter-arm region Q4 and the inter-element region Q5 are penetrated.

Figure 10:
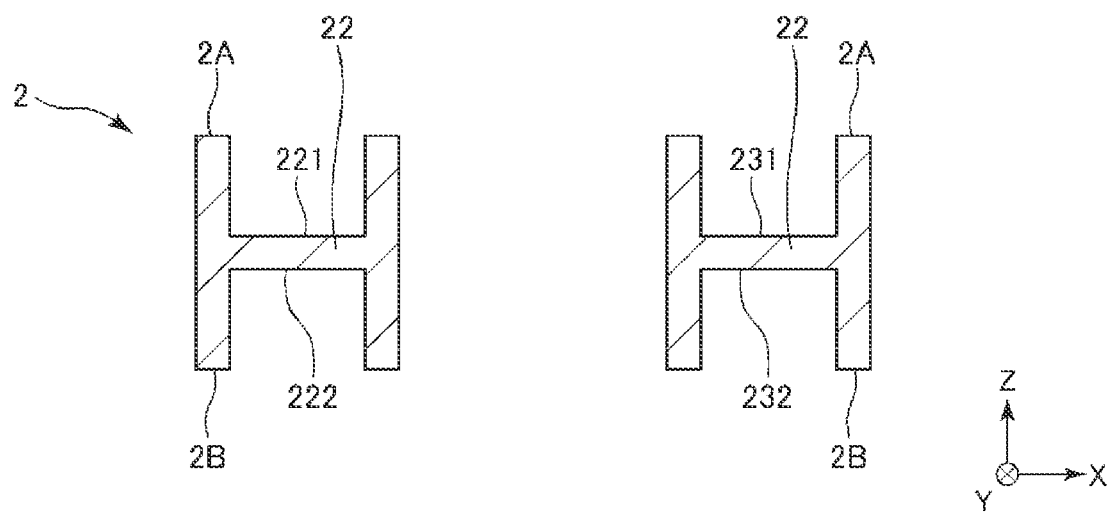
FIG. 10 is a cross-sectional view illustrating the method for manufacturing the vibration element of FIG. 1.

As illustrated in FIG. 10, after the present step is ended, the second protective film 6 and the metal film M2 are removed. Accordingly, a plurality of vibrating substrates 2 are collectively formed from the quartz crystal substrate 20.

Electrode Forming Step S6

A metal film is formed on the surface of the vibrating substrate 2 and patterned to form the electrode 3.

From the above, the vibration element 1 is obtained. As described above, the dry etching enables the treatment without being affected by crystal faces of the quartz crystal, so that an excellent dimensional accuracy can be realized. The first grooves 221 and 231 and the second grooves 222 and 232 and the contour shape of the vibrating substrate 2 are collectively formed, so that steps for manufacturing the vibration element 1 can be reduced and the vibration element can be manufactured in a low cost. Displacement of the first grooves 221 and 231 and the second grooves 222 and 232 with respect to the contour shape is prevented, and a forming accuracy of the vibrating substrate 2 is improved.

The method for manufacturing the vibration element is described above. Next, conditions for more reliably exerting the micro-loading effect will be described. FIG. 11 illustrates a relation between W/A and Wa/Aa when the etching times are different. As can be seen from FIG. 11, the micro-loading effect is remarkably exerted in a region where W/A 40% at each time.

The micro-loading effect also changes depending on a reaction gas type used in the dry etching. FIG. 12 illustrates a relation between W/A and Wa/Aa when three different types of general reaction gases are used.

For example, when a fluorine-based gas containing a large amount of carbon such as $C_2F_4$, $C_2F_6$, $C_3F_6$, or $C_4F_8$ is used as a reaction gas, a thick side wall protective film is obtained, and an inclination decreases as a gas type G3. Therefore, Wa/Aa can be easily increased with a shape in which the width A is smaller than the width W, and a size of the vibration element 1 can be reduced. For example, when designing a frequency and the CI value, it may be necessary for the width W to be equal to or above a certain value and the depth Wa to be close to the depth Aa. In that case, in order to reduce the size of the vibration element 1, it is necessary to reduce the width A, and in such a case, at least one of $C_2F_4$, $C_2F_6$, $C_3F_6$, and $C_4F_8$ is particularly effective.

Meanwhile, when a fluorine-based gas having a low carbon content or no carbon such as $SF_6$ or $CF_4$ is used alone or in combination with the fluorine-based gas containing the large amount of carbon, the side wall protective film becomes thinner, and the inclination increases as a gas type G1. Therefore, the width A can be increased with respect to the width W while keeping the depth Wa larger with respect to the depth Aa. For example, when a width of each of the first and second vibrating arms 22 and 23 is desired to be narrowed and the width A is desired to be increased while increasing the depth Wa, at least one of $SF_6$ and $CF_4$ is particularly effective.

When W/A=x and Wa/Aa=y, the gas type G1 is represented by the following Formula (1), a gas type G2 is represented by the following Formula (2), and the gas type G3 is represented by the following Formula (3).

$$y=-4.53\times10^{-6}x^4+3.99\times10^{-4}x^3-1.29\times10^{-3}x^2+1.83\times10^{-1}x \quad (1)$$

$$y=-5.59\times10^{-8}x^4+1.48\times10^{-5}x^3-1.43\times10^{-3}x^2+6.09\times10^{-2}x \quad (2)$$

$$y=-6.90\times10^{-10}x^4+5.47\times10^{-7}x^3-1.59\times10^{-4}x^2+2.03\times10^{-2}x \quad (3)$$

As illustrated in FIG. 12, if y is in a region P between Formulas (1) and (3), that is, if y satisfies the following Formulas (4) and (5), the micro-loading effect can be more reliably exerted by using a general reaction gas. Therefore, the manufacturing of the vibration element 1 becomes easy, and the manufacturing cost can be reduced.

$$y\geq-4.53\times10^{-6}x^4+3.99\times10^{-4}x^3-1.29\times10^{-3}x^2+1.83\times10^{-1}x \quad (4)$$

$$y\leq-6.90\times10^{-10}x^4+5.47\times10^{-7}x^3-1.59\times10^{-4}x^2+2.03\times10^{-2}x \quad (5)$$

If y does not satisfy Formula (4), a change in the depth Wa with respect to a change in the width W increases, and the depth Wa may vary. The variation can be prevented if y satisfies Formula (4). If y does not satisfy Formula (5), y becomes difficult to increase in a region where x is large, and the depth Wa becomes shallow. Alternatively, in order to increase the depth Wa, it is necessary for W to be approximately equal to A, and a shape restriction is likely to occur. The problem can be prevented if y satisfies Formula (5).

Here, for example, when the width W and the depth Wa are constant, if the gas type G2 is selected, the width A can be made smaller than that of the gas type G1, and the size of the vibration element 1 can be reduced. If the gas type G3 is selected, the width A can be made smaller than that of the gas type G2, and the size of the vibration element 1 can be further reduced. As described above, from the viewpoint of reducing the size, y is preferably in a region P, and more preferably in a region PP between Formulas (2) and (3). That is, y should satisfy the following Formula (6) and the above Formula (5).

$$y\geq-5.59\times10^{-8}x^4+1.48\times10^{-5}x^3-1.4\times10^{-3}x^2+6.09\times10^{-2}x \quad (6)$$

FIG. 13 illustrates an improving effect of the CI value of the vibration element 1 when the first grooves 221 and 231 and the second grooves 222 and 232 are formed. From FIG. 13, it is preferable that Wa/Aa≥0.2. In the present embodiment, Wa/Aa<1 because the micro-loading effect is used. Accordingly, the CI value can be reduced to 30% or less as compared with a case where the first grooves 221 and 231 and the second grooves 222 and 232 are not formed. Therefore, the vibration element 1 having excellent vibration characteristics can be manufactured. Further, it is preferable that Wa/Aa≥0.4, which can reduce the CI value to 10% or less as compared with a case where the first grooves 221 and 231 and the second grooves 222 and 232 are not formed.

The method for manufacturing the vibration element is described above. As described above, the method for manufacturing the vibration element 1 is a method for manufacturing the vibration element 1 including the base portion 21; and the first vibrating arm 22 and the second vibrating arm 23 extending from the base portion 21 along the Y-axis direction, that is, the first direction and arranged along the X-axis direction, that is, the second direction intersecting the Y-axis direction, in which the first vibrating arm 22 and the second vibrating arm 23 each includes the first surface 2A and the second surface 2B arranged in the Z-axis direction intersecting the Y-axis direction and the X-axis direction and on the front and back sides, respectively, the bottomed first grooves 221 and 231 opened in the first surface 2A, and the bottomed second grooves 222 and 232 opened in the second surface 2B. The method includes: the preparing step S1 of preparing the quartz crystal substrate 20 having the first surface 2A and the second surface 2B; the first protective film forming step S2 of forming the first protective film 5 on the first surface 2A of the quartz crystal substrate 20, excluding the first groove forming regions Q1 where the first grooves 221 and 231 are formed and the inter-arm region Q4 located between the first vibrating arm forming region Q2 where the first vibrating arm 22 is formed and the second vibrating arm forming region Q3 where the second vibrating arm 23 is formed; the first dry etching step S3 of dry etching the quartz crystal substrate 20 from the first surface 2A side via the first protective film 5 and forming the first grooves 221 and 231 and contours of the first vibrating arm 22 and the second vibrating arm 23 on the first surface 2A; the second protective film forming step S4 of forming the second protective film 6 on the second surface 2B of the quartz crystal substrate 20, excluding the second groove forming regions Q6 where the second grooves 222 and 232 are formed and the inter-arm region Q4; and the second dry etching step S5 of dry etching the quartz crystal substrate 20 from the second surface 2B side via the second protective film 6 and forming the second grooves 222 and 232 and contours of the first vibrating arm 22 and the second vibrating arm 23 on the second surface 2B. Wa/Aa<1 in at least one of the first dry etching step S3 and the second dry etching step S5, wherein Wa indicates the depth of each of the first grooves 221 and 231 formed in the first dry etching step S3 and the depth of each of the second grooves 222 and 232 formed in the second dry etching step S5, and Aa indicates the depth of the contour formed in the first dry etching step S3 and the depth of the contour formed in the second dry etching step S5. According to such a manufacturing method, the first grooves 221 and 231 and the second grooves 222 and 232 and the contour shape of the vibrating substrate 2 can be collectively formed. Therefore, the steps for manufacturing the vibration element can be reduced and the vibration element 1 can be manufactured in a low cost. The displacement of the first grooves 221 and 231 and the second grooves 222 and 232 with respect to the contour shape is prevented, and the forming accuracy of the vibrating substrate 2 is improved.

As described above, in the method for manufacturing the vibration element 1, it is preferable that Wa/Aa≥0.2. Accordingly, the CI value can be reduced to 30% or less as compared with the case where the first grooves 221 and 231 and the second grooves 222 and 232 are not formed. Therefore, the vibration element 1 having excellent vibration characteristics can be manufactured.

As described above, in the method for manufacturing the vibration element 1, Formula (4) is preferably satisfied when W/A=x and Wa/Aa=y, wherein W indicates the width of each of the first grooves 221 and 231 and the second grooves 222 and 232 along the X-axis direction, and A indicates the width of the inter-arm region Q4 along the X-axis direction. Accordingly, the micro-loading effect can be more reliably exerted by using a general reaction gas. Therefore, the manufacturing of the vibration element 1 becomes easy, and the manufacturing cost can be reduced. If y does not satisfy Formula (4), the change in the depth Wa with respect to the change in the width W becomes large, and the depth Wa may vary. The variation can be prevented if y satisfies Formula (4).

As described above, in the method for manufacturing the vibration element 1, the above Formula (5) is preferably satisfied. Accordingly, the micro-loading effect can be more reliably exerted by using the general reaction gas. Therefore, the manufacturing of the vibration element 1 becomes easy, and the manufacturing cost can be reduced. If y does not satisfy Formula (5), y becomes difficult to increase in the region where x is large, and the depth Wa becomes shallow. Alternatively, in order to increase the depth Wa, it is necessary for W to be approximately equal to A, and the shape restriction is likely to occur. The problem can be prevented if y satisfies Formula (5).

As described above, in the method for manufacturing the vibration element 1, at least one of $C_2F_4$, $C_2F_6$, $C_3F_6$, and $C_4F_8$ is preferably used as the reaction gas in the first dry etching step S3 and the second dry etching step S5. Accordingly, Wa/Aa can be easily increased with the shape in which the width A is smaller than the width W, and the size of the vibration element 1 can be reduced.

As described above, in the method for manufacturing the vibration element 1, at least one of $CF_4$ and $SF_6$ is preferably used as the reaction gas in the first dry etching step S3 and the second dry etching step S5. Accordingly, the width A can be increased with respect to the width W while the depth Wa is kept larger than the depth Aa. Therefore, for example, the width of each of the first and second vibrating arms 22 and 23 can be narrowed and the width A can be increased while the depth Wa is increased.

The method for manufacturing the vibration element is described with the illustrated embodiment above, but the present disclosure is not limited thereto, and a configuration of each portion can be replaced with any configuration having the same function. Any other constituents may be added to the present disclosure. The embodiment may be combined as appropriate.

For example, in the embodiment described above, Wa/Aa<1 in both the first dry etching step S3 and the second dry etching step S5, but the present disclosure is not limited thereto, and Wa/Aa<1 may be satisfied in at least one of the first dry etching step S3 and the second dry etching step S5.

The vibration element manufactured by the method for manufacturing the vibration element according to the present disclosure is not particularly limited, and may be, for example, a vibration element LA as illustrated in FIGS. 14 and 15. In the vibration element LA, a pair of first grooves 221 are arranged in the X-axis direction on the first surface 2A of the first vibrating arm 22 and a pair of second grooves 222 are arranged in the X-axis direction on the second surface 2B, and similarly, a pair of first grooves 231 are arranged in the X-axis direction on the first surface 2A of the second vibrating arm 23, and a pair of second grooves 232 are arranged in the X-axis direction on the second surface 2B. In such a configuration, since the plurality of grooves are arranged, the width W of each groove tends to be narrowed. Therefore, it is preferable to use at least one of $SF_6$ and $CF_4$ as the reaction gas in the first and second dry etching steps S3 and S5. Accordingly, the grooves can be formed deeply and the CI value can be lowered.

The vibration element may be a double-ended tuning fork type vibration element 7 as illustrated in FIGS. 16 and 17. The electrode is not illustrated in FIGS. 16 and 17. The double-ended tuning fork type vibration element 7 includes a pair of base portions 711 and 712, and a first vibrating arm 72 and a second vibrating arm 73 connecting the base portions 711 and 712. The first and second vibrating arms 72 and 73 include bottomed first grooves 721 and 731 opened in a first surface 7A and bottomed second grooves 722 and 732 opened in a second surface 7B.

For example, the vibration element may be a gyro vibration element 8 as illustrated in FIGS. 18 to 20. The electrode is not illustrated in FIGS. 18 to 20. The gyro vibration element 8 includes a base portion 81, a pair of detection vibration arms 82 and 83 extending from the base portion 81 on both sides in the Y-axis direction, a pair of connecting arms 84 and 85 extending from the base portion 81 on both sides in the X-axis direction, driving vibration arms 86 and 87 extending from a tip portion of the connecting arm 84 to both sides in the Y-axis direction, and driving vibration arms 88 and 89 extending from a tip portion of the connecting arm 85 to both sides in the Y-axis direction. In such a gyro vibration element 8, when an angular velocity ωz around the Z-axis acts while the driving vibration arms 86, 87, 88, and 89 are flexurally vibrated in a direction of an arrow SD in FIG. 18, the detection vibration arms 82 and 83 are newly excited by the flexural vibration in a direction of an arrow SS by the Coriolis force, and the angular velocity ωz is detected based on an electric charge output from the detection vibration arms 82 and 83 by the flexural vibration.

The detection vibration arms 82 and 83 include bottomed first grooves 821 and 831 opened in a first surface 8A and bottomed second grooves 822 and 832 opened in a second surface 8B. The driving vibration arms 86, 87, 88, and 89 include bottomed first grooves 861, 871, 881, and 891 opened in the first surface 8A, and bottomed second grooves 862, 872, 882, and 892 opened in the second surface 8B, respectively. In such a gyro vibration element 8, a pair of vibrating arms adjacent to each other in the X-axis direction, for example, the detection vibration arm 82 and the driving vibration arm 86, the detection vibration arm 82 and the driving vibration arm 88, the detection vibration arm 83 and the driving vibration arm 87, and the detection vibration arm 83 and the driving vibration arm 89, can be the first vibrating arm and the second vibrating arm.

In a case of the gyro vibration element 8, it is structurally necessary to make the inter-arm region Q4 large. In such a case, the depth Wa becomes shallow in a region between the above Formulas (2) and (3), which may lead to a decrease in sensitivity. Therefore, it is preferable to use a region between the above Formulas (1) and (2).

For example, the vibration element may be a gyro vibration element 9 as illustrated in FIGS. 21 to 23. The gyro vibration element 9 includes a base portion 91, a pair of driving vibration arms 92 and 93 extending from the base portion 91 to a plus side in the Y-axis direction and arranged in the X-axis direction, and a pair of detection vibration arms 94 and 95 extending from the base portion 91 to a minus side in the Y-axis direction and arranged in the X-axis direction. In such a gyro vibration element 9, when an angular velocity ωy around the Y-axis acts while the driving vibration arms 92 and 93 are flexurally vibrated in a direction of an arrow SD in FIG. 21, the flexural vibration in a direction of an arrow SS is newly excited to the detection vibration arms 94 and 95 by the Coriolis force, and the angular velocity ωy is detected based on an electric charge output from the detection vibration arms 94 and 95 by the flexural vibration.

The driving vibration arms 92 and 93 include bottomed first grooves 921 and 931 opened in a first surface 9A, and bottomed second grooves 922 and 932 opened in a second surface 9B. The detection vibration arms 94 and 95 include bottomed first grooves 941 and 951 opened in the first surface 9A and bottomed second grooves 942 and 952 opened in the second surface 9B. In such a gyro vibration element 9, the driving vibration arms 92 and 93 or the detection vibration arms 94 and 95 are set as the first vibrating arm and the second vibrating arm.

What is claimed is:

1. A method for manufacturing a vibration element including:
    a base portion; and
    a first vibrating arm and a second vibrating arm extending from the base portion along a first direction and arranged along a second direction intersecting the first direction,
    the first vibrating arm and the second vibrating arm each including a first surface and a second surface arranged in a third direction intersecting the first direction and the second direction and on front and back sides, respectively, a bottomed first groove opened in the first surface, and a bottomed second groove opened in the second surface, the method comprising:
    a preparing step of preparing a quartz crystal substrate having the first surface and the second surface;
    a first protective film forming step of forming a first protective film on the first surface of the quartz crystal substrate, excluding first groove forming regions where the first grooves are formed and an inter-arm region located between a first vibrating arm forming region where the first vibrating arm is formed and a second vibrating arm forming region where the second vibrating arm is formed;
    a first dry etching step of dry etching the quartz crystal substrate from a first surface side via the first protective film and forming the first grooves and contours of the first vibrating arm and the second vibrating arm on the first surface;
    a second protective film forming step of forming a second protective film on the second surface of the quartz crystal substrate, excluding second groove forming regions where the second grooves are formed and the inter-arm region; and
    a second dry etching step of dry etching the quartz crystal substrate from a second surface side via the second protective film and forming the second grooves and contours of the first vibrating arm and the second vibrating arm on the second surface, wherein
    Wa/Aa<1 in at least one of the first dry etching step and the second dry etching step,
    Wa is a depth of the first grooves formed in the first dry etching step and a depth of the second grooves formed in the second dry etching step, and
    Aa is a depth of the contours formed in the first dry etching step and a depth of the contours formed in the second dry etching step.

2. The method for manufacturing the vibration element according to claim 1, wherein
    $Wa/Aa \geq 0.2$.

3. The method for manufacturing the vibration element according to claim 1, wherein $$y \geq -4.53 \times 10^{-6} x^4 + 3.99 \times 10^{-4} x^3 - 1.29 \times 10^{-3} x^2 + 1.83 \times 10^{-1} x$$

W is a width of each of the first grooves and the second grooves along the second direction,
    A is a width of the inter-arm region along the second direction,
    W/A=x, and
    Wa/Aa=y.

4. The method for manufacturing the vibration element according to claim 3, wherein $$y \leq -6.90 \times 10^{-10} x^4 + 5.47 \times 10^{-7} x^3 - 1.59 \times 10^{-4} x^2 + 2.03 \times 10^{-2} x.$$

5. The method for manufacturing the vibration element according to claim 1, wherein
    in the first dry etching step and the second dry etching step, at least one of $C_2F_4$, $C_2F_6$, $C_3F_6$, and $C_4F_8$ is used as a reaction gas.

6. The method for manufacturing the vibration element according to claim 1, wherein
    in the first dry etching step and the second dry etching step, at least one of $CF_4$ and $SF_6$ is used as a reaction gas.

* * * * *